United States Patent
Mori et al.

(10) Patent No.: US 7,002,203 B2
(45) Date of Patent: Feb. 21, 2006

(54) SEMICONDUCTOR MEMORY WITH NONVOLATILE MEMORY CELL ARRAY AND SEMICONDUCTOR DEVICE WITH NONVOLATILE MEMORY CELL ARRAY AND LOGIC DEVICE

(75) Inventors: Seiichi Mori, Tokyo (JP); Shigeru Atsumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 10/661,520

(22) Filed: Sep. 15, 2003

(65) Prior Publication Data

US 2005/0111269 A1 May 26, 2005

Related U.S. Application Data

(62) Division of application No. 09/956,876, filed on Sep. 21, 2001, now Pat. No. 6,642,569.

(30) Foreign Application Priority Data

Sep. 22, 2000 (JP) .............................. 2000-289129

(51) Int. Cl.
   *H01L 29/76* (2006.01)
(52) U.S. Cl. ...................... 257/314; 257/315; 257/316
(58) Field of Classification Search ................ 257/314, 257/315, 316
   See application file for complete search history.

(56) References Cited

U.S. PATENT DOCUMENTS

| 5,293,512 | A | 3/1994 | Nishigoori et al. |
| 5,295,105 | A | 3/1994 | Atsumi |
| 5,736,442 | A | 4/1998 | Mori |
| 5,850,091 | A | 12/1998 | Li et al. |
| 6,060,741 | A | 5/2000 | Huang |
| 6,201,275 | B1 | 3/2001 | Kawasaki et al. |
| 6,240,021 | B1 | 5/2001 | Mori |
| 6,355,526 | B1 | 3/2002 | Furuhata |

OTHER PUBLICATIONS

H. Watanabe, et al. "Novel 0.44 μm2 Ti-Salicides STI Cell Technology for High-Density NOR Flash Memories and High Performance Embedded Application" IEDM Technical Digest, 1998 pp. 975-978.

*Primary Examiner*—Christian D. Wilson
*Assistant Examiner*—Douglas Menz
(74) *Attorney, Agent, or Firm*—Oblon, Spivak, McClelland, Maier & Neustadt, P.C.

(57) ABSTRACT

A semiconductor device at least has a memory cell array. The memory cell array has active regions extending linearly in parallel with one another at predetermined intervals and each containing alternating source and drain regions, gate electrodes orthogonally crossing the active regions between the source and drain regions and each having a floating gate and a control gate laid one upon another, first conductors extending linearly in parallel with the gate electrodes and connected to corresponding ones of the source regions through source contacts, and second conductors connected to corresponding ones of the drain regions through drain contacts.

10 Claims, 14 Drawing Sheets

WRITE

FIG.12B

ERASE

FIG.12C

READ

DESIGN PATTERN → RESIST PATTERN

FIG.15B

DESIGN PATTERN → RESIST PATTERN

SEMICONDUCTOR MEMORY WITH NONVOLATILE MEMORY CELL ARRAY AND SEMICONDUCTOR DEVICE WITH NONVOLATILE MEMORY CELL ARRAY AND LOGIC DEVICE

CROSS REFERENCE TO RELATED APPLICATIONS

This application claims benefit of priority under 35 USC 119 on Japanese Patent Application No. P2000-289129 filed on Sep. 22, 2000, the entire contents of which are incorporated by reference herein.

BACKGROUND OF THE INVENTION

1. Field of the Invention

The present invention relates to a semiconductor memory having a nonvolatile memory cell array, and particularly, to the structure of source wiring in the memory cell array.

2. Description of the Related Art

Figure 1:
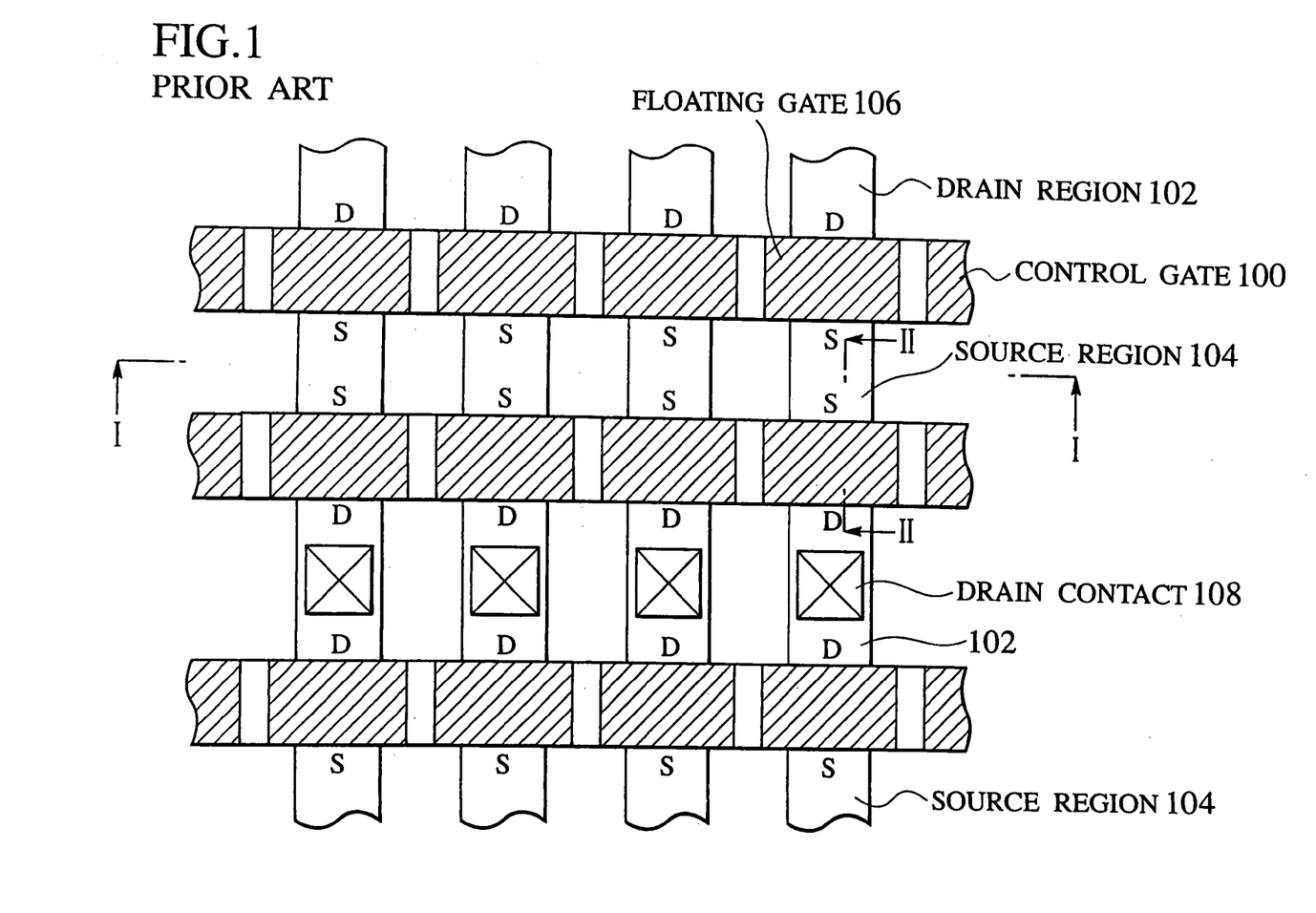
FIG. 1 is a plan view showing a memory cell array of a NOR flash memory according to the first prior art.
Figure 2A:
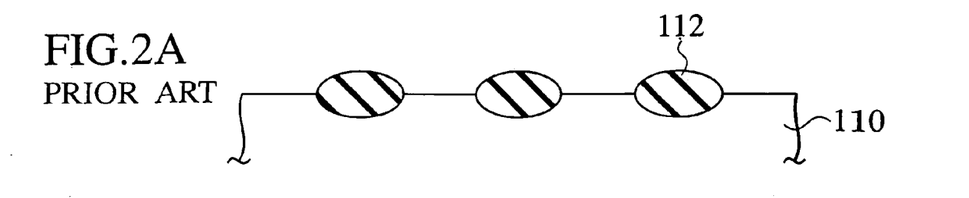
FIG. 2A is a sectional view taken along a line I—I of FIG. 1 showing element isolation regions formed by the LOCOS method.
Figure 2B:
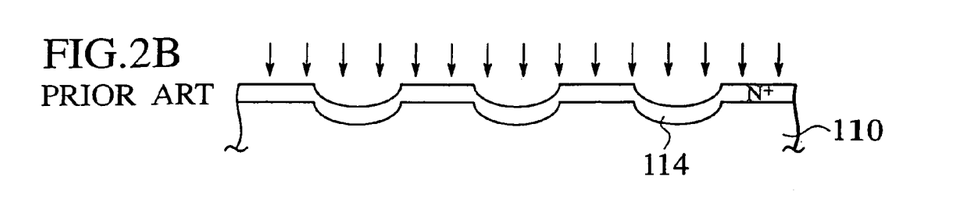
FIG. 2B is a sectional view taken along the line I—I of FIG. 1 showing a SAS structure formed from the structure of FIG. 2A.

Flash memories are roughly classified into NOR flash memories and NAND flash memories based on cell array structures. The NOR flash memories are randomly accessible and are appropriate for high-speed read applications. FIG. 1 is a plan view showing a memory cell array in a NOR flash memory according to a first prior art. This prior art employs a SAS (self-aligned source) structure to reduce cell size. The SAS structure is formed by forming word lines (control gates 100 in FIG. 1), removing an element isolation oxide film in a self-aligning manner with respect to the word lines, and forming a diffusion layer on the part where the oxide film has been removed. The diffusion layer forms drain regions 102 and source regions 104. FIGS. 2A and 2B are sectional views taken along a line I—I of FIG. 1, in which FIG. 2A is before the removal of the element isolation oxide film 112 and FIG. 2B is after the removal of the same. The oxide film 112 is formed by LOCOS (localized oxidation of silicon) method. After the removal of the oxide film 112, ions are implanted to form the diffusion layer 114 of $n^+$-type.

Figure 3A:
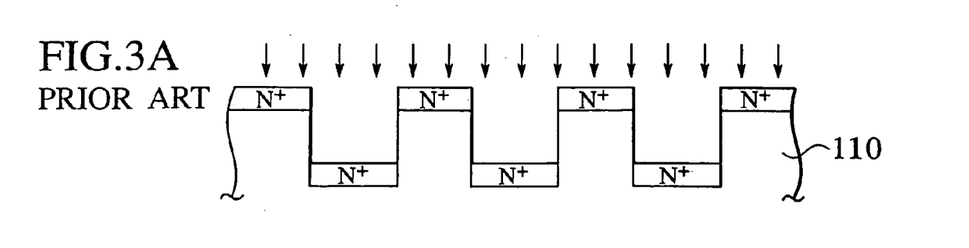
FIG. 3A is a sectional view taken along the line I—I of FIG. 1 showing a SAS structure formed from a structure having element isolation regions made by the STI method, the SAS structure having vertically implanted ions.
Figure 3B:
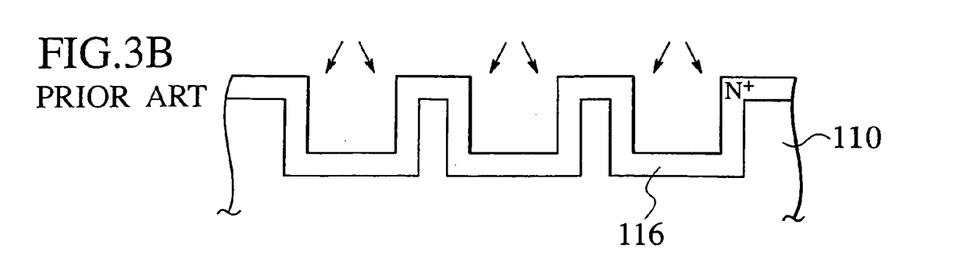
FIG. 3B is a sectional view taken along the line I—I of FIG. 1 showing a similar SAS structure but with obliquely implanted ions.
Figure 4A:
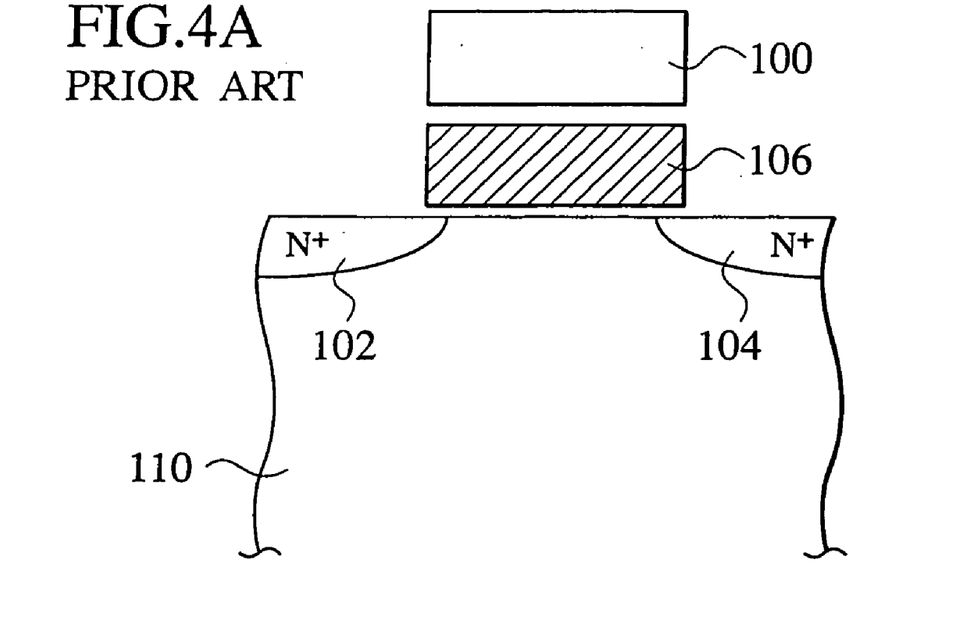
Figure 4B:
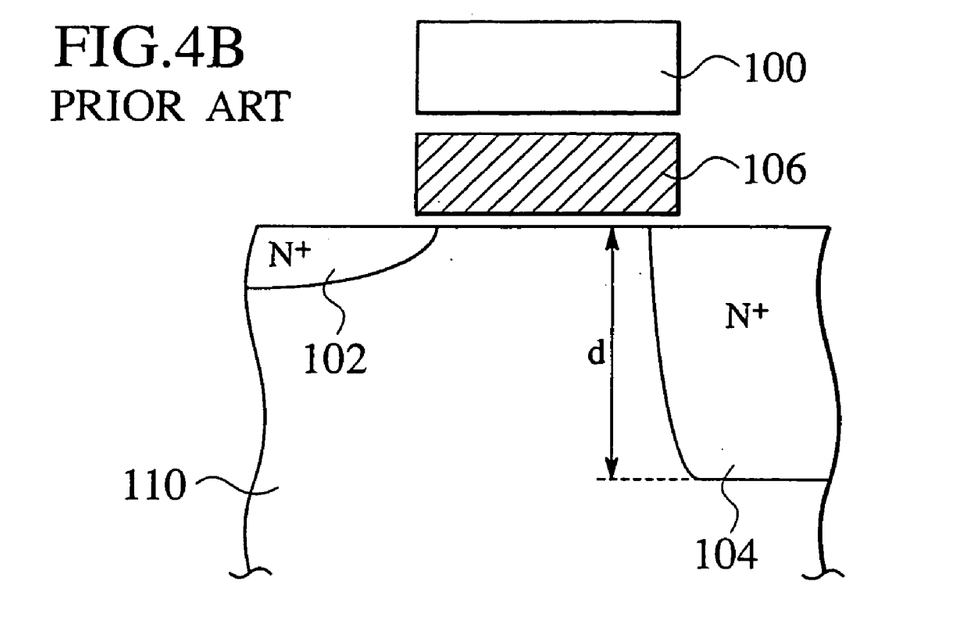

A recently used element isolation method is STI (shallow trench isolation) method, which is effective to reduce a memory cell array. Applying the STI method to the memory cell array of FIG. 1 causes a problem. FIGS. 3A and 3B are sectional views taken along the line I—I of FIG. 1 assuming that the memory cell array of FIG. 1 is formed by the STI method. Trenches are formed in a substrate 110, and an insulating film is formed over the trenches. An element isolation region formed by the STI method is steeper than that formed with the element isolation oxide film 112 of FIG. 2A of the LOCOS method. In FIG. 3A, ions are vertically implanted into the substrate 110, and no diffusion layer is formed on each side face of each trench from which an element isolation oxide film (not shown) has been removed. In FIG. 3B, ions are obliquely implanted into the substrate 110. This may form an $n^+$-type diffusion layer 116 on each trench side face, too. The structure of FIG. 3B, however, causes a problem shown in FIG. 4B. Compared with a normal memory cell transistor of FIG. 4A, the structure of FIG. 4B involves a source region 104 having a very deep depth "d" due to horizontally diffused impurities. This results in increasing the resistance of the source region 104 and deteriorating read/write performance. To avoid the problem, the prior art must form metal source wiring connected to source regions 104 at predetermined intervals in parallel with bit lines. This source wiring increases a memory cell array area.

Figure 5:
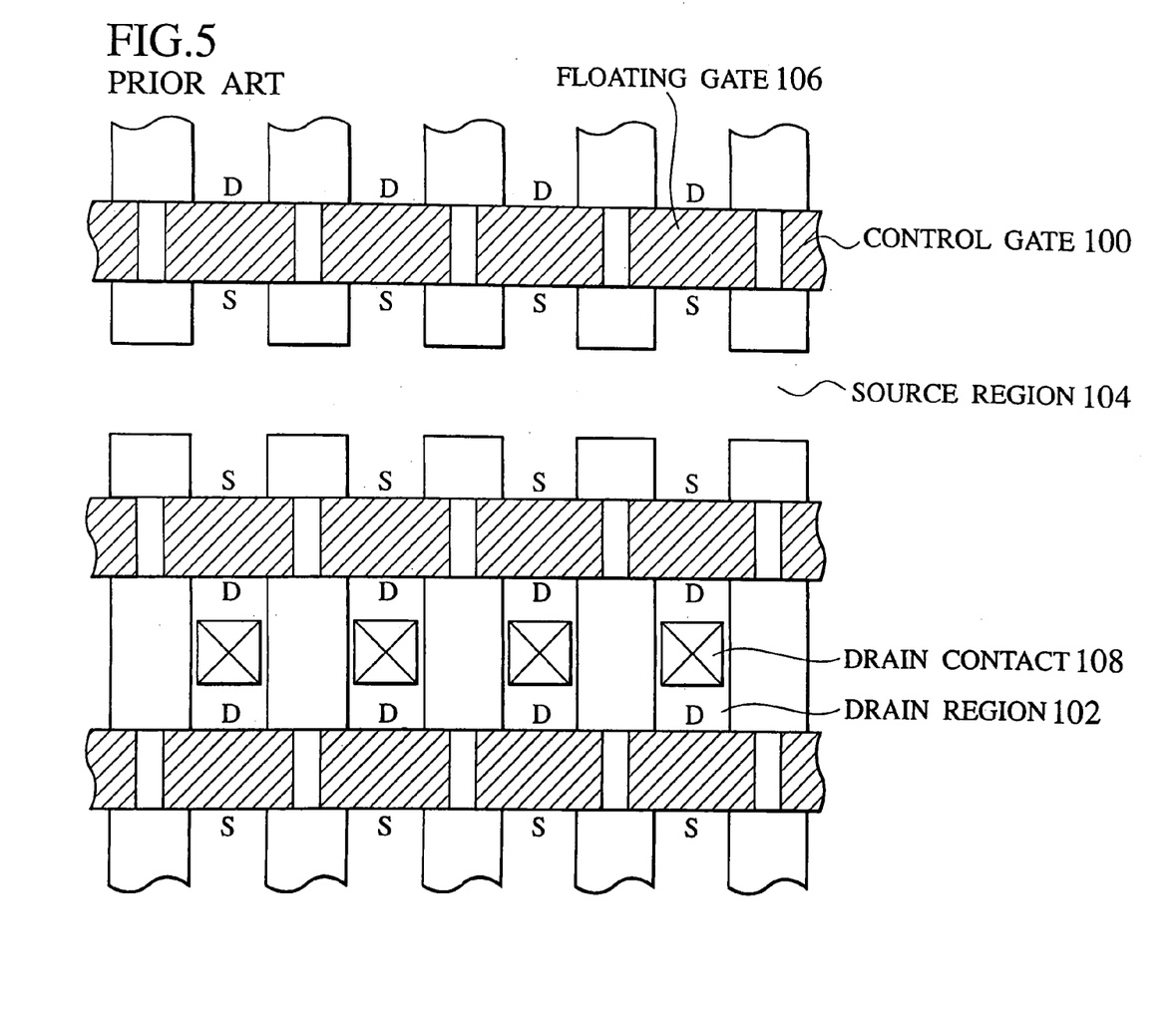
FIG. 5 is a plan view partly showing a memory cell array in a NOR flash memory according to the second prior art.
Figure 6:
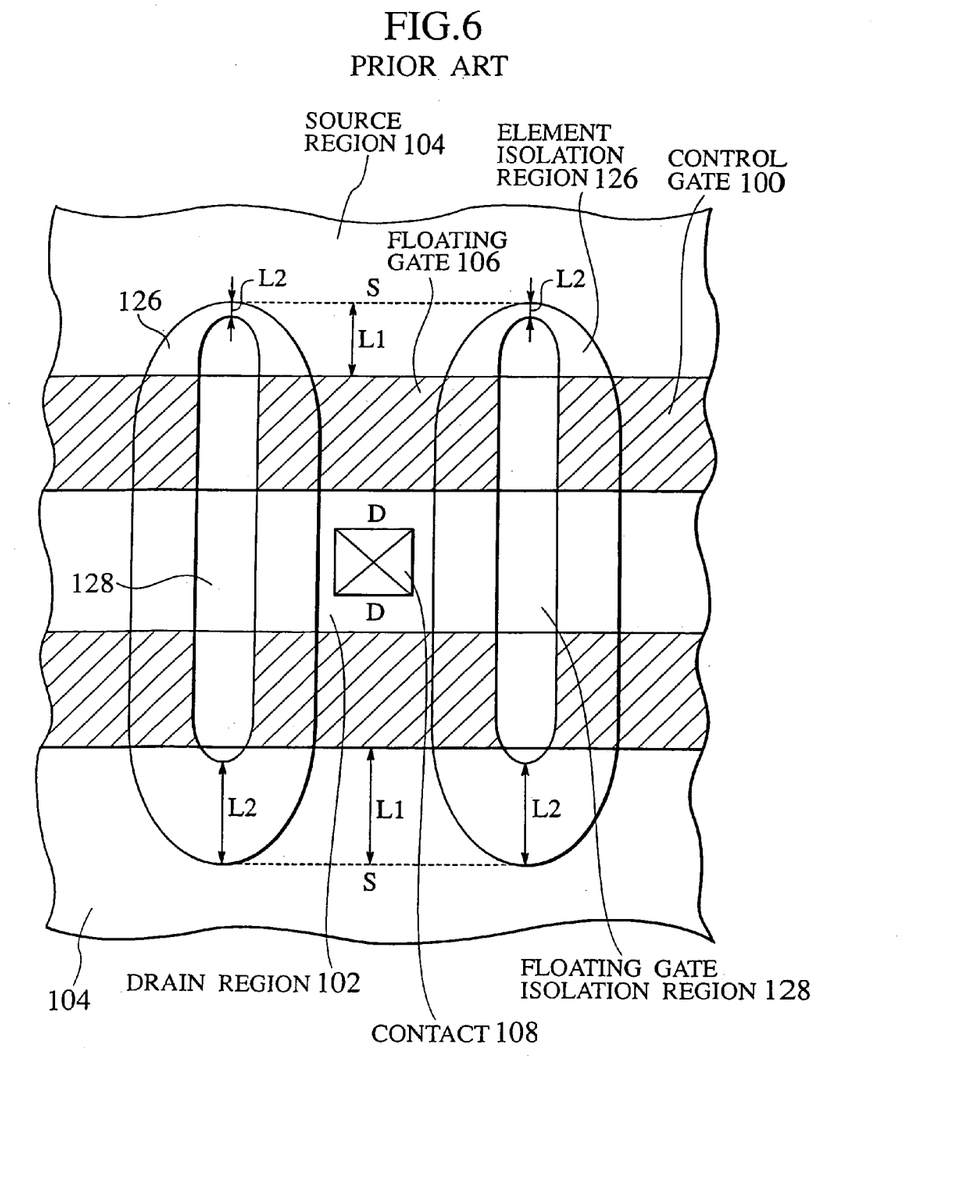
FIG. 6 is a plan view explaining the structural problem of the memory cell array of FIG. 5.

FIG. 5 shows a second prior art that employs an extended source region 104, instead of the SAS structure. However, the extended source region 104 of FIG. 5 increases a cell size. Namely, a distance L1 shown in FIG. 6 must be long enough to absorb positioning errors in a lithography process, prevent variations in the shapes of channel regions, and avoid unstableness in memory cell characteristics, in particular, between vertically formed memory cells. A distance L2 shown in FIG. 6 must also be large enough to prevent a floating gate isolation region 128 from overlapping the source region 104 in the lithography process. If the overlapping happens, the source region 104 will be etched off in an etching process that follows the lithography process. It is difficult to maintain the shape of the The island-shaped floating gate isolation region 128. If there are positioning errors between the floating gate isolation regions 128 and control gates 100 to vary the shapes of the control gates 100 between even and odd lines, there will be large cell characteristic differences between the even and odd lines.

BRIEF SUMMARY OF THE INVENTION

An aspect of the present invention provides a nonvolatile semiconductor memory having a memory cell array. The memory cell array includes active regions extending linearly in parallel with one another and containing impurity diffused source and drain regions, element isolation regions extending linearly and isolating the active regions from one another, gate electrodes orthogonally crossing the active regions and element isolation regions and each having a floating gate and a control gate laid one upon another, and first metal conductors extending linearly in parallel with the gate electrodes and each connecting the source regions to one another between adjacent ones of the gate electrodes. The drain regions are connected via the first metal conductors or direct to a second metal conductors.

BRIEF DESCRIPTION OF THE SEVERAL VIEWS OF THE DRAWINGS

FIGS. 4A and 4B are sectional views explaining the problem of the SAS structure with obliquely implanted ions, in which FIG. 4A shows a normal state and FIG. 4B an abnormal state;

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Reference)

Figure 7:
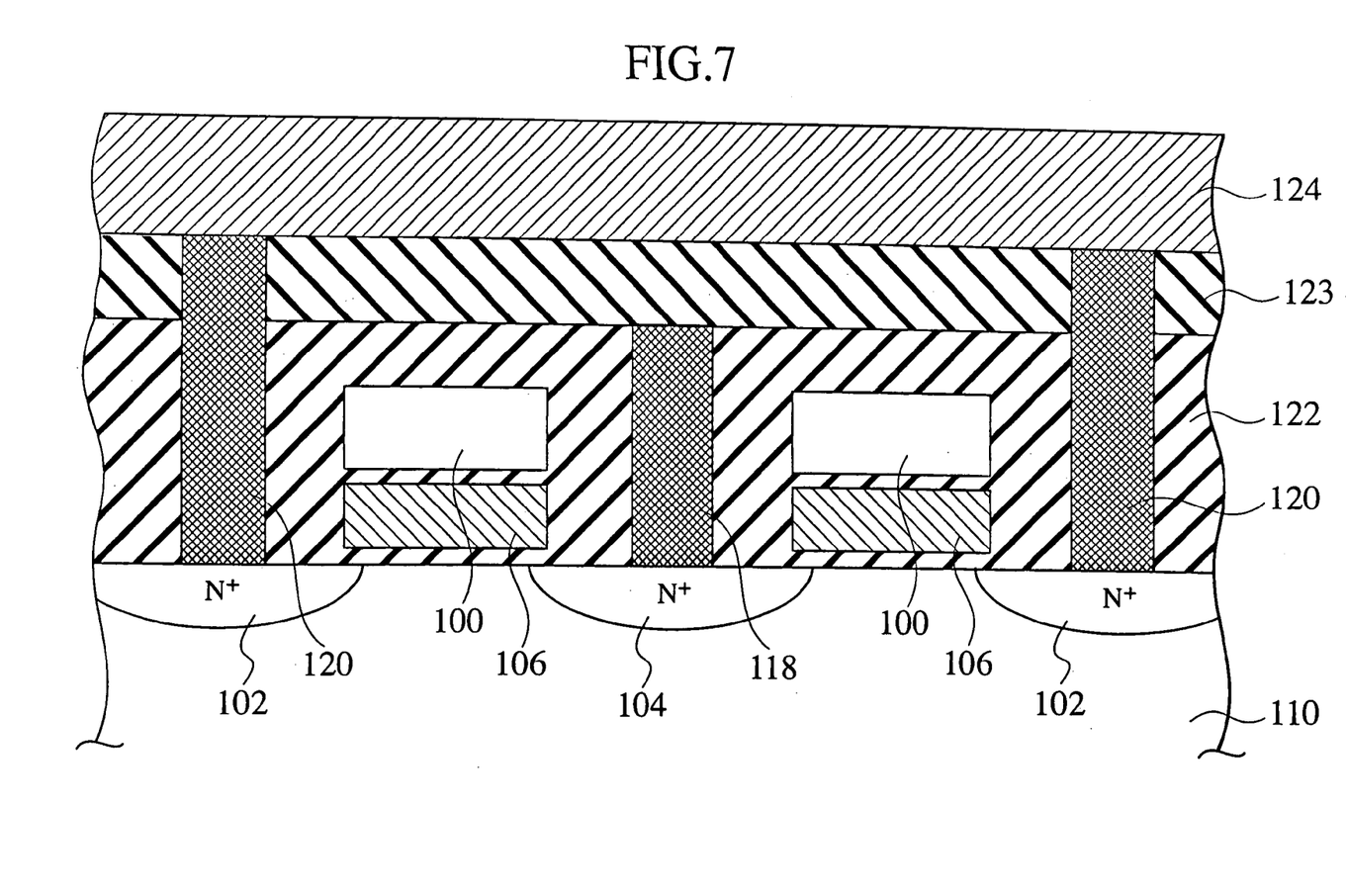
FIG. 7 is a sectional view partly showing a memory cell array in a NOR flash memory according to the reference of the present invention.
Figure 8:
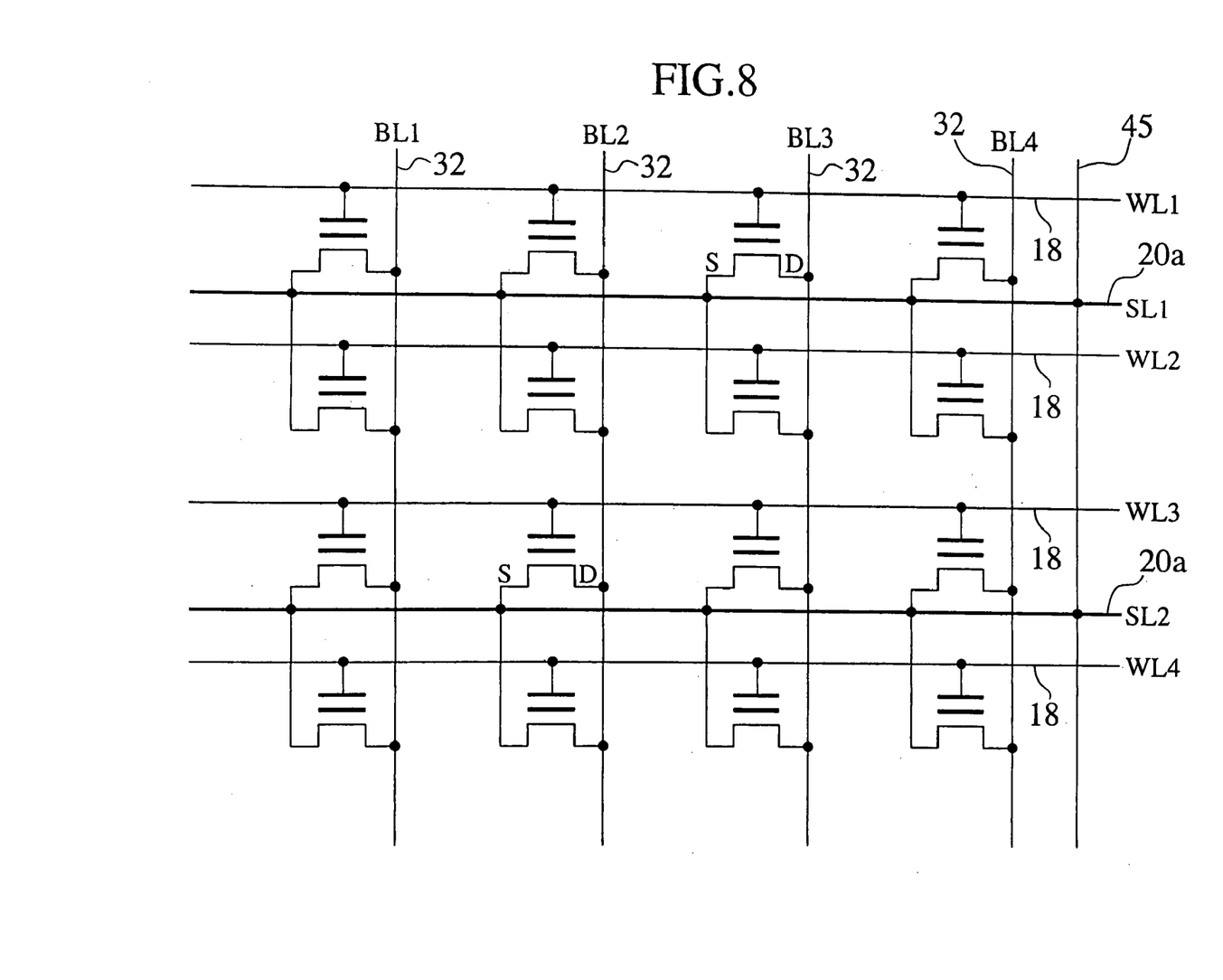
FIG. 8 is an equivalent circuit diagram showing the memory cell array in a NOR flash memory with metal wiring connecting source diffusion layer according to the reference of the present invention.

FIG. 7 shows a reference of the present invention that forms local wiring serving exclusively for source regions. In FIG. 7, stripe-shaped source regions 104 are connected to each other through high-melting point metal wiring 118 made of, typically, tungsten (W). To form the metal wiring 118, an additional manufacturing process is needed. In addition, the high-melting point metal wiring 118 requires a drain contact 120 to be extended through interlayer insulating films 122 and 123, to connect a drain region 102 to metal wiring 124 serving as a bit line. This results in increasing an aspect ratio, insufficiently filling the contacts 120 with metal, and increasing the resistance of the contacts 120. The resistance drops further than connecting through the diffusion layer, when the source regions are connected to each other through the high-melting point metal wiring 118. But a wiring resistance of the high-melting point metal wiring 118 is higher than a wiring resistance of a metal wiring. There are cases in which many memory cells exist in the array and in which it connects a large number of source diffusion regions and the case in which the resistance value becomes a problem. The performance is lowered, when the resistance value is not enough. It is necessary for the resistance to be reduced by connecting a source diffusion layer through metal wiring 45 for the source parallel placed with a bit line in every some cells, as shown in FIG. 8, in order to prevent the lowering of the performance.

(Embodiment)

Figure 9:
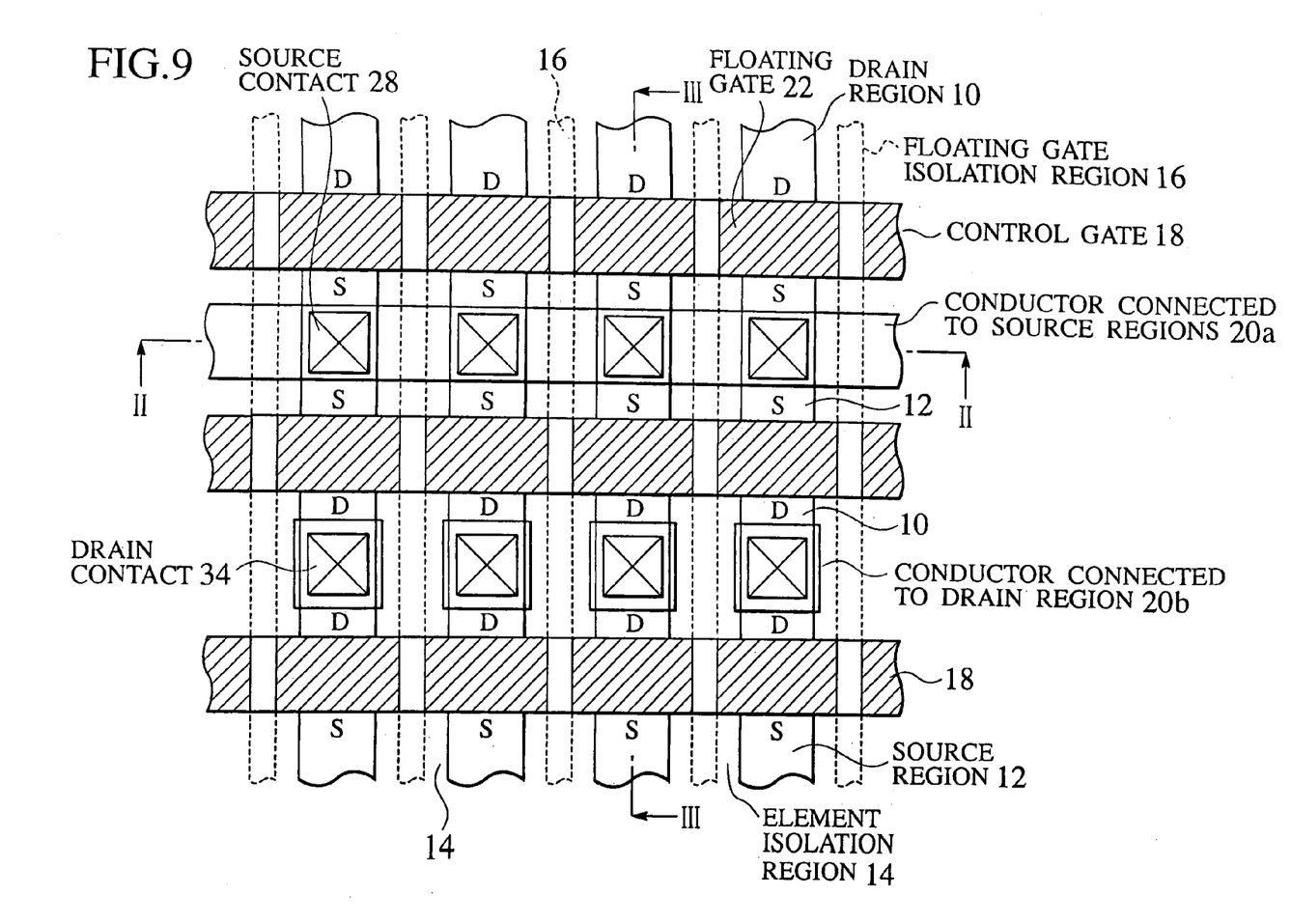
FIG. 9 is a plan view partly showing a memory cell array in a NOR flash memory according to an embodiment of the present invention.

FIG. 9 is a plan view partly showing a memory cell array in a NOR flash memory according to an embodiment of the present invention. The memory cell array includes drain regions 10, source regions 12, element isolation regions 14, floating gate isolation regions 16, and control gates 18 serving as word lines. The control gates 18 orthogonally cross the regions 10, 12, 14, and 16. The regions 10, 12, 14, and 16 are basically linear and are arranged like stripes.

Each memory cell in the memory cell array contains a drain region 10 and a source region 12. The source regions 12 between the adjacent control gates 18 are connected to one another through a conductor 20a. Each drain region 10 is connected to a discrete island-shaped conductor 20b, which is connected to a bit line formed in an upper metal wiring layer (not shown). The conductors 20a and 20b are formed from a single metal wiring layer.

Figure 10A:
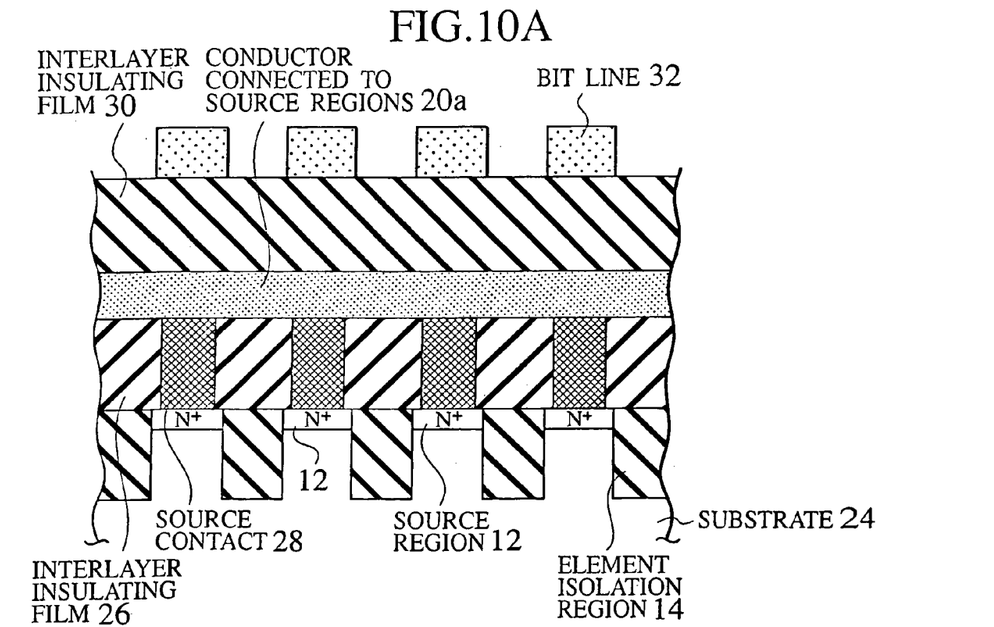
FIG. 10A is a sectional view taken along a line II—II of FIG. 9.
Figure 10B:
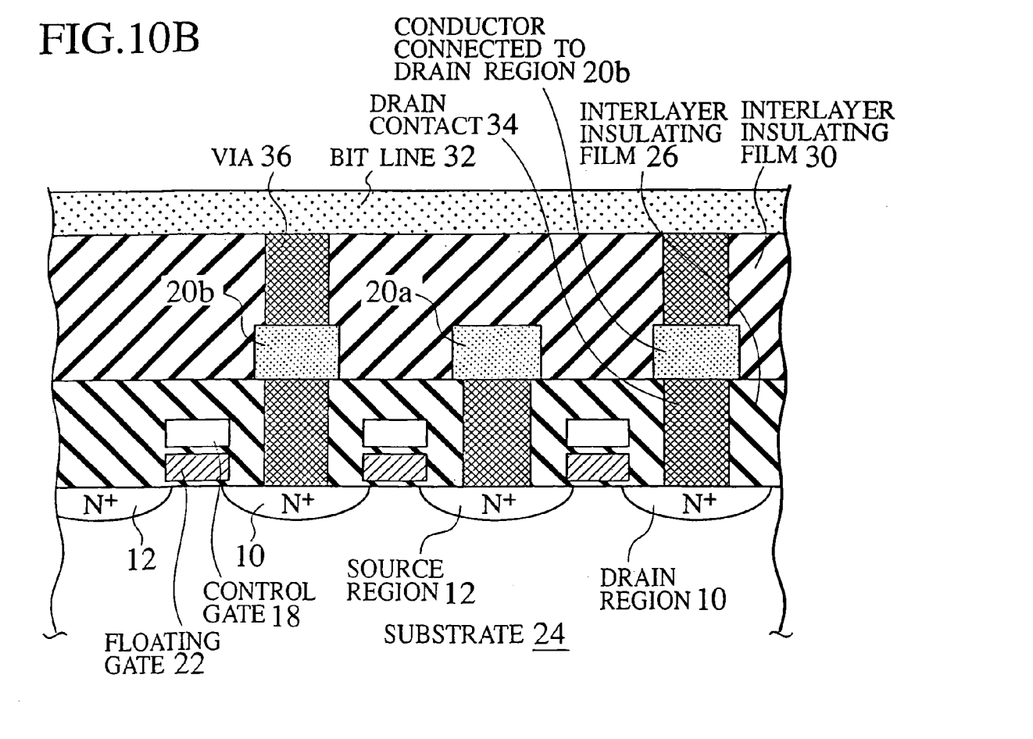
FIG. 10B is a sectional view taken along a line III—III of FIG. 9.
Figure 11:
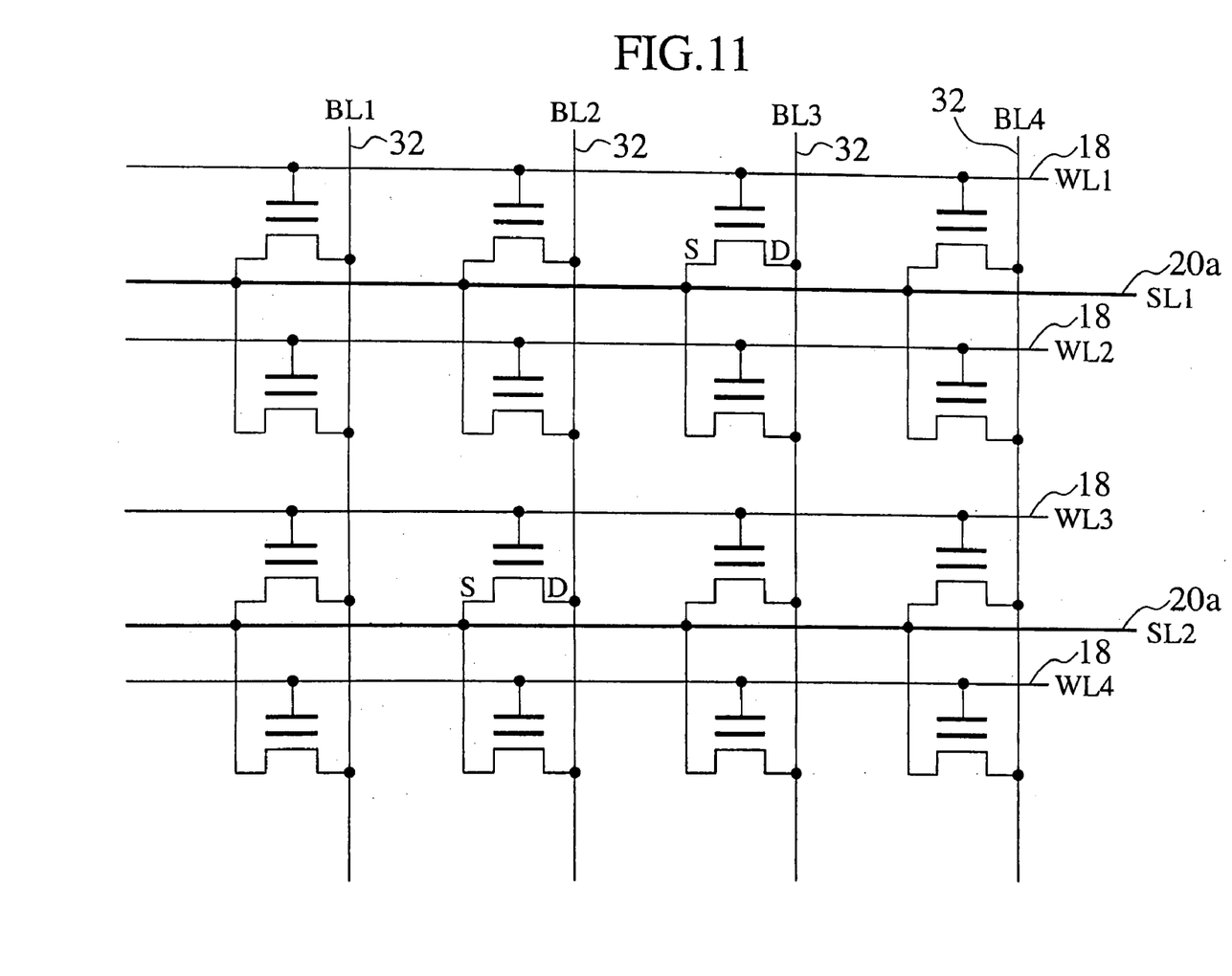
FIG. 11 is an equivalent circuit diagram showing the memory cell array of FIG. 9.

FIG. 10A is a sectional view taken along a line II—II of FIG. 9, FIG. 10B is a sectional view taken along a line III—III of FIG. 9, and FIG. 11 is an equivalent circuit diagram showing the memory cell array of FIG. 9. In FIG. 10A, the source region 12 in each memory cell is connected to a source contact 28 formed through an interlayer insulating film 26. The source contact 28 is connected to the conductor 20a. In FIG. 10B, the drain region 10 in each memory cell is connected to a drain contact 34 formed through the interlayer insulating film 26. The drain contact 34 is connected to the conductor 20b, which is connected to a via 36 formed through an interlayer insulating film 30. The via 36 is connected to the bit line 32.

In FIG. 11, the memory cell array contains a matrix of memory cells each having a floating gate and a control gate. A word line WL is provided for each row of memory cells and is connected to the control gates of the memory cells in the row. A bit line BL is provided for each column of memory cells and is connected to the drain regions of the memory cells in the column. A source line SL is provided for a pair of adjacent memory-cell rows and is connected to the source regions of the memory cells in the paired rows.

Figure 12A:
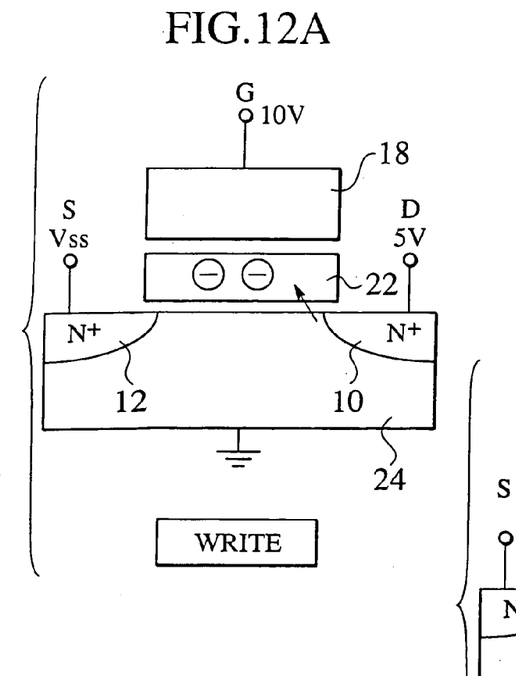
FIGS. 12A, 12B, and 12C are sectional views showing write, erase, and read operations, respectively, in a memory cell of the memory cell array of FIG. 9.
Figure 12B:
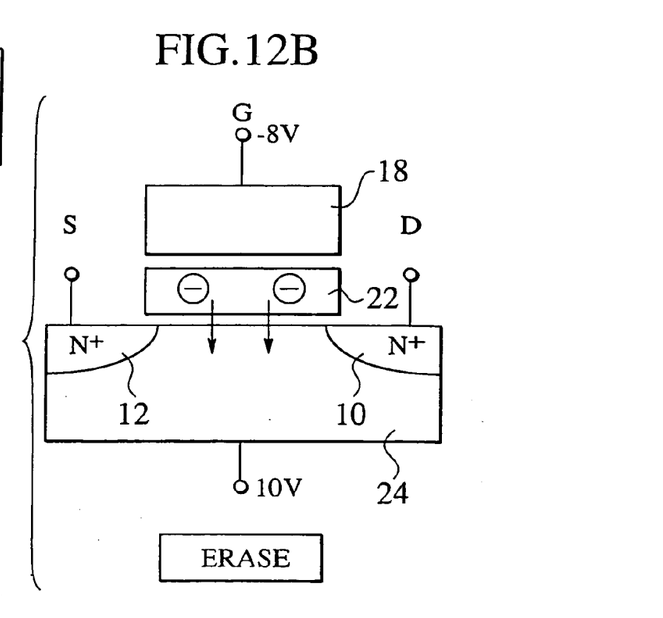
Figure 12C:
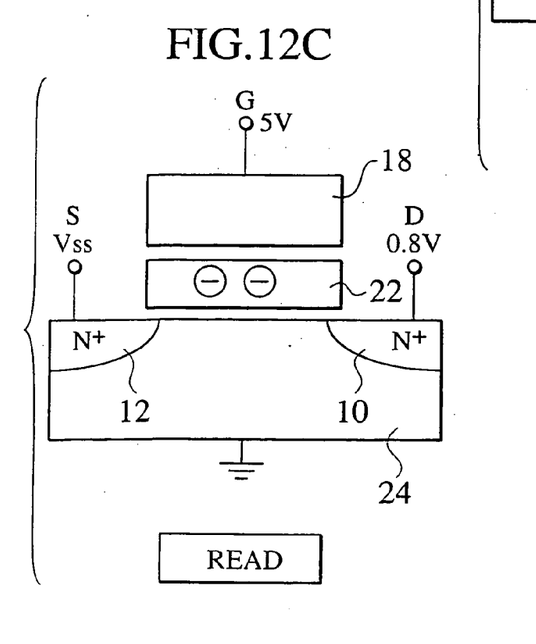

FIG. 12A shows a write operation, FIG. 12B an erase operation, and FIG. 12C a read operation in any one of the memory cells in the memory cell array of FIG. 9. The write operation is carried out by applying, for example, 10 V to the control gate 18, 5V to the drain region 10, and a ground voltage Vss to the source region 12. As a result, electrons flow from the drain region 10 to the source region 12. The electrons are accelerated due to a potential difference between the drain region 10 and the source region 12. Part of the electrons become hot electrons, which are captured by the floating gate 22. The erase operation is carried out by applying, for example, −8 V to the control gate 18 and 10 V to a substrate 24. As a result, an FN (Fowler-Nordheim) current draws the electrons from the floating gate 22 to the substrate 24. The erase operation is carried out on the memory cells block by block. The read operation is carried out by applying, for example, 5V to the control gate 18 and 0.8 V to the drain region 10 and by testing whether or not the memory cell is conductive. Any memory cell having electrons captured in the floating gate 22 is nonconductive, and any memory cell having no electrons in the floating gate 22 is conductive.

The structure of the embodiment is effective to reduce a cell size. In the case of the second prior art of FIG. 5, a lateral cell size is 2.2 F and a longitudinal cell size is 3.8 F at a minimum due to the margins mentioned above. As a result, the total cell size of the related art is 8.36 $F^2$. Here, "F" is a minimum design rule. On the other hand, the embodiment of FIG. 9 involves a lateral cell size of 2.2 F and a longitudinal cell size of 3 F. This means that the total cell size of the embodiment is 6.6 $F^2$, which is 25% smaller than that of the related art.

According to the embodiment, the source side and drain side in each memory cell are symmetrical with each other below the contacts 28 and 34. This symmetry reduces stress during manufacturing, thereby reducing crystal defects. Since the drain region 10 and source region 12 in each memory cell have an identical impurity distribution, an erase operation using an FN current will effectively be carried out.

The embodiment is effective when applied to a semiconductor device provided with a memory and a logic device. When installing a memory and a logic device on a single chip, efforts must be made to minimize additional processes and reduce a cell size in the memory. A standard logic device involves two or more wiring layers. Without adding processes to the process of forming the wiring layers, the embodiment is capable of installing the standard logic device and a flash memory of small cells and minimum characteristic variations on a single chip.

The embodiment is particularly effective when applied to NOR flash memories. A standard NOR flash memory passes a cell current of 100 to 300 μA for a write operation carried out by channel hot electron injection, and 10 μA or higher for a high-speed random access read operation. To achieve these operations, source lines must have low resistance and must be fixed at a reference voltage of, for example, 0 V. If the source line voltage fluctuates, a voltage at each source region fluctuates. This fluctuation deteriorates the write and read performance of each memory cell. For example, the second prior art of FIG. 5 extends the source region 104 to form source wiring. The source region 104, i.e., a diffusion region generally has a sheet resistance of several tens of ohms. Even if the second prior art arranges a source shunting conductor for every 32 memory cells, the source region of a cell farthest from the source shunting conductor will have a parasitic resistance of about 1 kΩ. In this case, the source voltage will fluctuate by 100 mV at a minimum in a write operation and 10 mV at a minimum in a read operation.

On the other hand, the embodiment connects the source regions 12 to one another through the conductor 20a whose sheet resistance is 1/1000 or below that of the diffusion layer in which the source regions 12 are formed. This eliminates the source shunting conductor of the related art and greatly reduces source resistance, thereby reducing a cell size and improving the write and read performance of each memory cell.

The embodiment is also advantageous in an erase operation. When drawing electrons from an entire channel of each memory cell for an erase operation, there will be erase speed differences among memory cells if the memory cells involve coupling ratio differences. If such erase speed differences occur, the threshold values of the memory cells will show a distribution range. To cope with this problem, the present invention forms the diffusion regions 10 and 12, floating gate isolation regions 16, etc., in stripes, to minimize shape variations and cell coupling ratio differences, thereby minimizing a distribution range of threshold values.

Figure 13A:
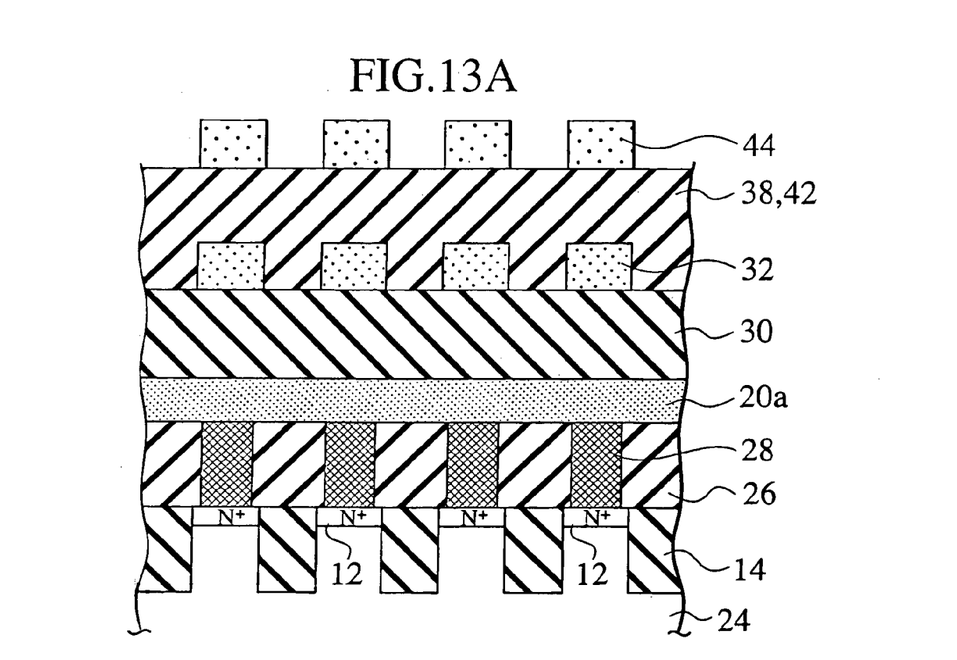
FIG. 13A is a sectional view partly showing a memory cell array according to an embodiment of the present invention installed with a logic device having a fourth wiring layer, this view corresponding to the sectional view taken along the line II—II of FIG. 9.
Figure 13B:
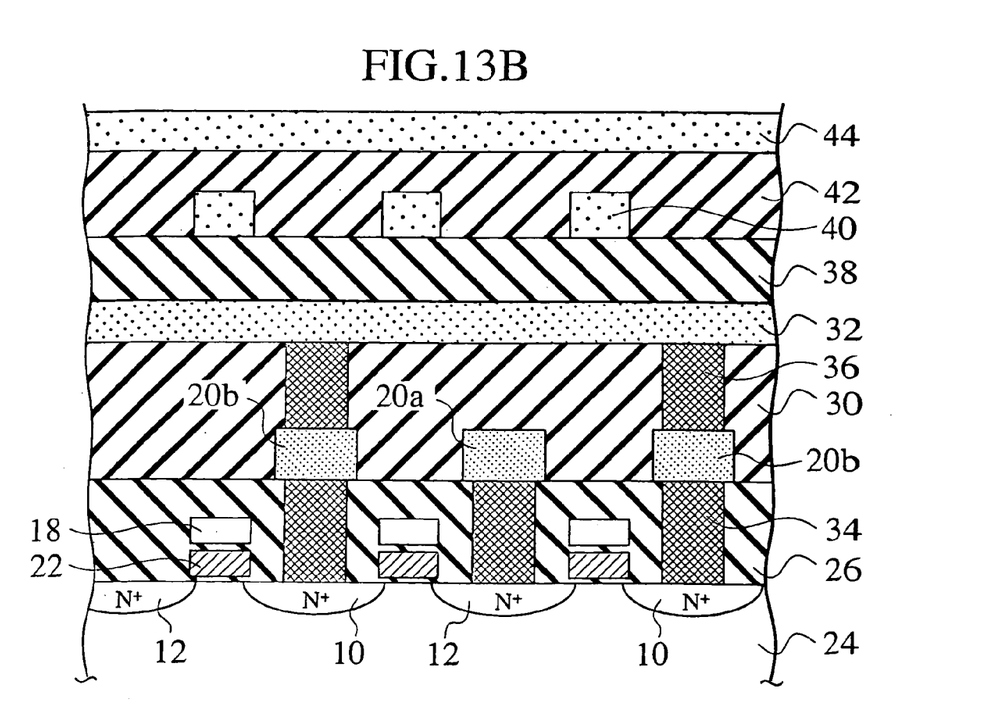
FIG. 13B is a sectional view partly showing the memory cell array of FIG. 13A, corresponding to the sectional view taken along the line III—III of FIG. 9.

FIG. 13A is a sectional view partly showing a memory cell array according to an embodiment of the present invention installed with a logic device having a fourth wiring layer, this view corresponding to the sectional view taken along the line II—II of FIG. 9. FIG. 13B is a sectional view showing the memory cell array of FIG. 13A, corresponding to the sectional view taken along the line III—III of FIG. 9. Conductors 40 formed from a third metal wiring layer are used as shunt lines for word lines 18, and conductors 44 formed from a fourth metal wiring layer are used as sub-bit lines extending in parallel with bit lines 32.

Figure 14:
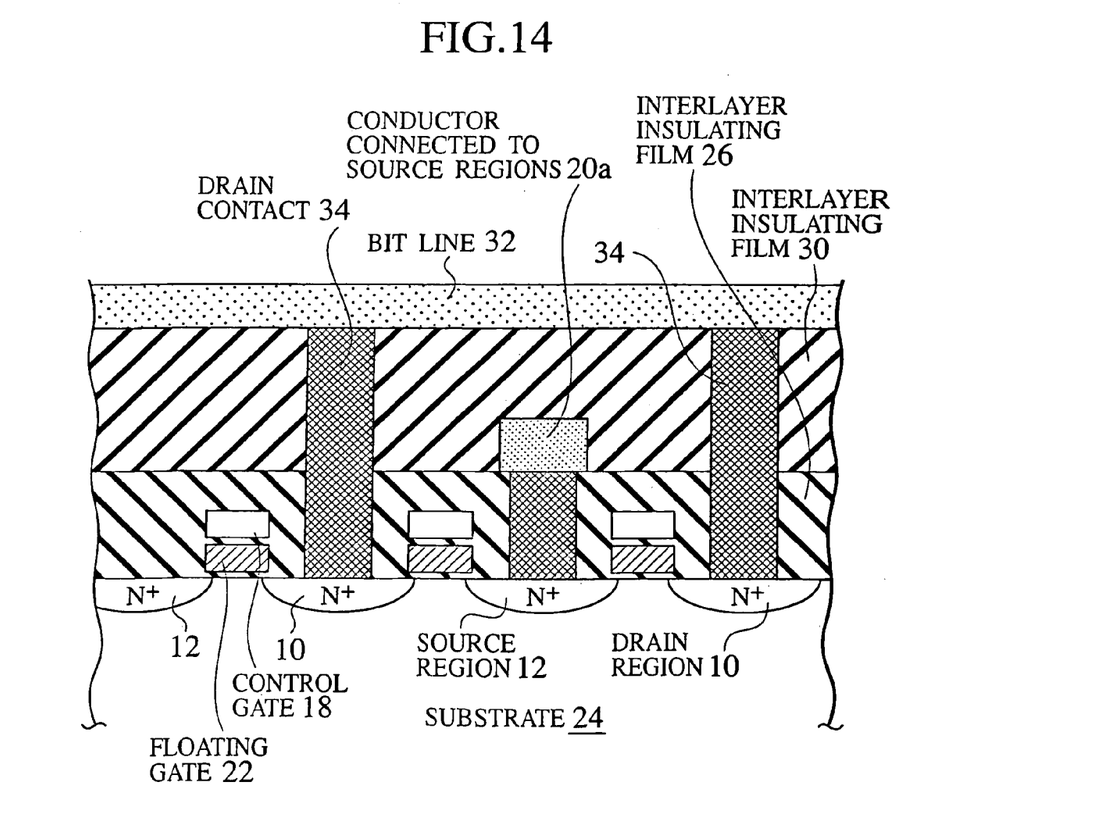
FIG. 14 is a sectional view partly showing a memory cell array in a NOR flash memory according to an embodiment of the present invention without conductors dedicated to drain regions.

In FIGS. 13A and 13B, each memory cell has a drain region 10, which is connected to the bit line 32 through a conductor 20b. The drain conductors 20b may be omitted as shown in FIG. 14. In FIG. 14, a drain region 10 of each memory cell is connected to a drain contact 34 formed through interlayer insulating films 26 and 30, and the drain contact 34 is connected to a bit line 32.

In the example of FIG. 14, a source contact 28 on each source region 12 and the drain contact 34 on each drain region 10 must be formed in separate processes. This is a disadvantage in terms of the number of processes, compared with the reference of FIG. 7 that employs the conductors 118 for the source regions 104. The conductors 118, however, are usually made of tungsten. On the other hand, the conductors 20a of the present invention of FIG. 14 are usually made of aluminum or aluminum-based alloy of low resistance. Namely, the resistance of the conductors 20a of FIG. 14 is lower than that of FIG. 7. In addition, the use of the tungsten conductors 118 is limited to memory cells and is not versatile. On the other hand, the conductors 20a for the source regions 12 are versatile because of their material. For example, they may be applicable to the wiring of peripheral circuits, to improve the concentration of the peripheral circuits.

In FIG. 14, the first wiring layer to form the conductors 20a is preferable to be thin. If the first wiring layer is thick, it increases the aspect ratios of the second wiring layer from which the bit lines 32 are formed and the drain contacts 34 connected to the drain regions 10, respectively. When using the wiring layers for peripheral circuits, the first wiring layer is used for short wiring in which parasitic resistance causes little problem, and the second wiring layer formed above the first wiring layer is used for long wiring that must have low resistance. In an area where the peripheral circuits are formed, the conductors formed from the first and second wiring layers may freely cross each other, to easily form an optional pattern layout. The first wiring layer helps increase a pattern concentration compared with the reference of FIG. 7 having no first wiring layer.

Figure 15A:
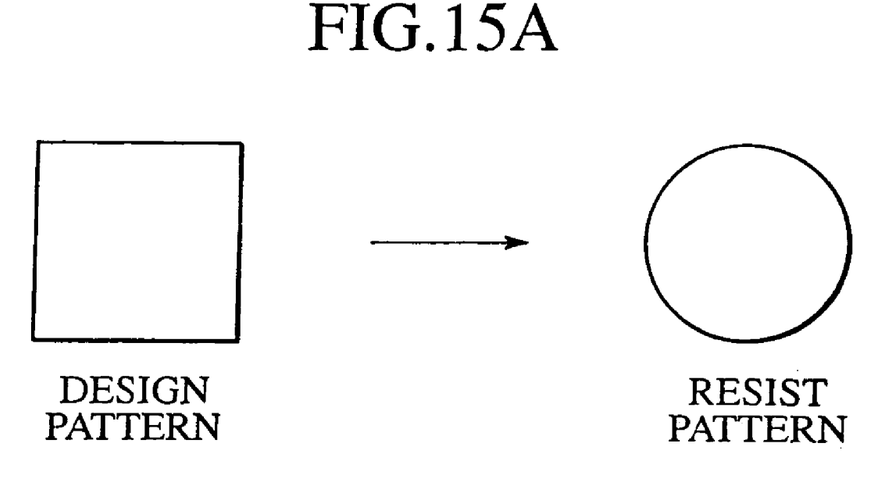
FIG. 15A shows a design pattern of the drain conductor 20b of FIG. 9 and a resist pattern formed from the design pattern.
Figure 15B:
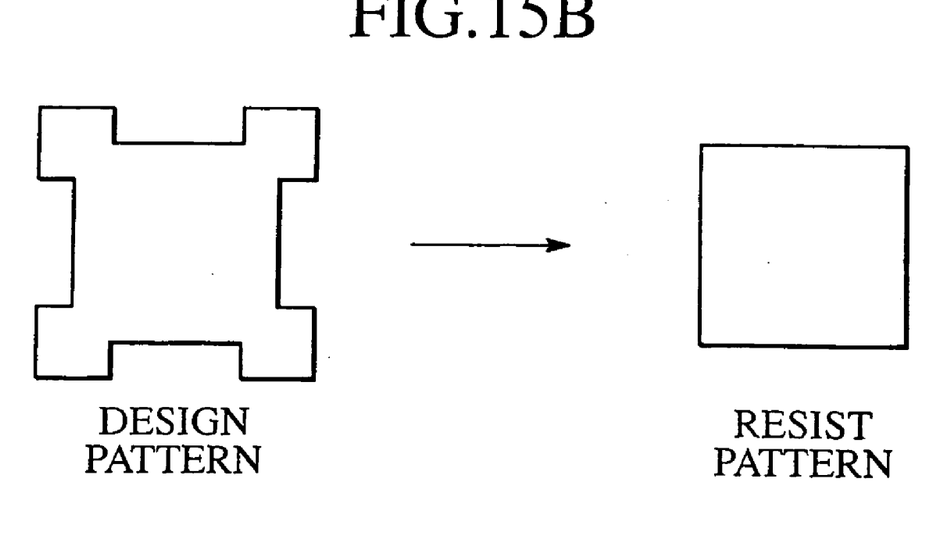
FIG. 15B shows a corrected design pattern based on the design pattern of FIG. 15A and a resist pattern formed from the corrected design pattern.

The conductor 20b of FIG. 9 connected to a drain region is a discrete island-shaped fine pattern. If this pattern is designed to be square on a photomask as shown in FIG. 15A, it will be circular with four corners being rounded when transferred onto a resist. In this case, the via 36 of FIG. 10B will be out of the conductor 20b even with a slight positioning error in the via 36. To avoid this, the conductor 20b may be designed to have a pattern shown in FIG. 15B. This pattern will become square when transferred onto a photoresist.

As explained above, the nonvolatile semiconductor memory according to the embodiment is producible without greatly increasing the number of manufacturing processes and is capable of reducing the resistance of source regions in the memory cell array in the nonvolatile semiconductor memory.

The metal conductor has been exemplified material including aluminum as representative things. But it is effective to material, for example, the copper having resistance lower than aluminum.

Although the present invention has been explained in connection with several embodiments, it must be understood that the present invention is not limited by the embodiments or the accompanying drawings.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device at least having a nonvolatile memory at least having a memory cell array structure that comprises:
    active regions extending linearly in parallel with one another and containing impurity diffused source and drain regions;
    element isolation regions extending linearly and isolating the active regions from one another;
    gate electrodes orthogonally crossing the active regions and element isolation regions and each having a floating gate and a control gate laid one upon another;
    first conductors formed from a first metal wiring layer, the first conductors extending linearly in parallel with the gate electrodes and each connecting the source regions to one another between adjacent ones of the gate electrodes; and
    second conductors formed from a second metal wiring layer that is above the first metal wiring layer, the second conductors orthogonally crossing the gate electrodes and connected to the drain regions through contacts.

2. The semiconductor device of claim 1, wherein the memory cell array structure further comprises:
    floating electrode isolation regions orthogonally crossing the gate electrodes and isolating the floating electrodes from one another.

3. The semiconductor device of claim 1, wherein:
    the element isolation regions have trenches.

4. The semiconductor device of claim 1, wherein:
    the memory cell array structure contains NOR memory cells.

5. The semiconductor device of claim 1, wherein the memory cell array structure further comprises:
    source contacts each connecting one of the source regions to a corresponding one of the first conductors; and
    drain contacts each connecting one of the drain regions to a corresponding one of the second conductors,
    wherein the source regions and drain regions being symmetrical with each other about the gate electrodes.

6. The semiconductor device of claim 5, wherein:
    the source regions and drain regions substantially have an identical impurity concentration.

7. The semiconductor device of claim 5, wherein:
    a bit line and the second conductors are being connected further than the first conductors in a upper layer.

8. The semiconductor device of claim 1, wherein a sheet resistance value of the first conductors is $\frac{1}{1000}$ or below of a sheet resistance value of the source regions.

9. The semiconductor device of claim 1, wherein:
    the first conductors are made of material selected from a group consisting of aluminum and aluminum-based alloys.

10. The semiconductor device of claim 1, wherein the first and second conductors are made of a copper.

* * * * *